US011807518B1

(12) United States Patent
Berger et al.

(10) Patent No.: US 11,807,518 B1
(45) Date of Patent: Nov. 7, 2023

(54) MULTI-DIE INTEGRATED CIRCUIT PACKAGE

(71) Applicant: SiTime Corporation, Santa Clara, CA (US)

(72) Inventors: Renata M. Berger, Palo Alto, CA (US); Ginel C. Hill, Sunnyvale, CA (US); Paul M. Hagelin, Saratoga, CA (US); Charles I. Grosjean, Los Gatos, CA (US); Aaron Partridge, Cupertino, CA (US); Joseph C. Doll, Mountain View, CA (US); Markus Lutz, Mountain View, CA (US)

(73) Assignee: SiTime Corporation, Santa Clara, CA (US)

( * ) Notice: Subject to any disclaimer, the term of this patent is extended or adjusted under 35 U.S.C. 154(b) by 76 days.

(21) Appl. No.: 15/627,049

(22) Filed: Jun. 19, 2017

Related U.S. Application Data

(62) Division of application No. 13/759,013, filed on Feb. 4, 2013, now Pat. No. 9,695,036.

(60) Provisional application No. 61/617,230, filed on Mar. 29, 2012, provisional application No. 61/594,357, filed on Feb. 2, 2012.

(51) Int. Cl.
*B81B 3/00* (2006.01)
*H03H 9/02* (2006.01)
*H03H 9/24* (2006.01)

(52) U.S. Cl.
CPC ......... *B81B 3/0024* (2013.01); *H03H 9/02448* (2013.01); *H03H 9/2405* (2013.01)

(58) Field of Classification Search
CPC ... B03B 3/0024; H03H 9/02448; H03H 9/2405; H01L 2224/32145; H01L 2924/1461; B81B 7/0083-0096
See application file for complete search history.

(56) References Cited

U.S. PATENT DOCUMENTS 6,325,848 B1  12/2001  Watanabe
7,202,761 B2   4/2007  Lutz et al.
(Continued)

FOREIGN PATENT DOCUMENTS

WO  2005025057 A2   3/2005
WO  2011042597 A1   4/2011
WO  2012110708 A1*  8/2012 .................. H03H 9/02

OTHER PUBLICATIONS

Frangi, Attilio et al., "Interface dissipation in piezoelectric MEMS resonators: an experimental and numerical nvestigation," Sensors, 2013 IEEE, Nov. 3-6, 2013, Baltimore, MD, pp. 1-4, ISSN: 1930-0395.
(Continued)

*Primary Examiner* — Eric K Ashbahian

(57) ABSTRACT

The present inventions, in one aspect, are directed to micro-machined resonator comprising: a first resonant structure extending along a first axis, wherein the first axis is different from a crystal axis of silicon, a second resonant structure extending along a second axis, wherein the second axis is different from the first axis and the crystal axis of silicon and wherein the first resonant structure is coupled to the second resonant structure, and wherein the first and second resonant structures are comprised of silicon (for example, substantially monocrystalline) and include an impurity dopant (for example, phosphorus) having a concentrations which is greater than $10^{19}$ cm$^{-3}$, and preferably between $10^{19}$ cm$^{-3}$ and $10^{21}$ cm$^{-3}$.

23 Claims, 19 Drawing Sheets

(56) References Cited

U.S. PATENT DOCUMENTS

| | | | |
|---|---|---|---|
| 7,369,003 | B2 | 5/2008 | Hagelin |
| 7,369,004 | B2 | 5/2008 | Partridge et al. |
| 7,443,258 | B2 | 10/2008 | Hagelin |
| 7,446,619 | B2 | 11/2008 | Partridge et al. |
| 7,446,620 | B2 | 11/2008 | Partridge et al. |
| 7,545,228 | B1 | 6/2009 | Lu et al. |
| 7,586,239 | B1 | 9/2009 | Li et al. |
| 7,639,104 | B1 | 12/2009 | Quevy et al. |
| 8,022,554 | B2 | 9/2011 | Gupta et al. |
| 8,324,729 | B2 | 12/2012 | Gupta et al. |
| 8,558,643 | B2 | 10/2013 | Prunnila et al. |
| 8,669,664 | B2 | 3/2014 | Gupta et al. |
| 8,786,166 | B2 | 7/2014 | Jaakkola et al. |
| 8,916,942 | B2 | 12/2014 | Pensala et al. |
| 8,941,247 | B1 | 1/2015 | Gupta et al. |
| 9,071,226 | B2 | 6/2015 | Jaakkola et al. |
| 9,371,221 | B2 | 6/2016 | Gupta et al. |
| 9,821,998 | B2 | 11/2017 | Gupta et al. |
| 10,287,162 | B2 | 5/2019 | Gupta et al. |
| 2003/0062961 | A1* | 4/2003 | Ma et al. ............. B81B 3/0078 331/100 |
| 2003/0184412 | A1 | 10/2003 | Gorrell |
| 2005/0140467 | A1* | 6/2005 | Duwel et al. ............ H03H 3/02 333/189 |
| 2005/0195050 | A1 | 9/2005 | Lutz et al. |
| 2005/0242904 | A1 | 11/2005 | Lutz et al. |
| 2006/0261915 | A1 | 11/2006 | Lutz et al. |
| 2007/0120625 | A1 | 5/2007 | Larson et al. |
| 2007/0262831 | A1 | 11/2007 | Van Beek et al. |
| 2008/0150656 | A1* | 6/2008 | Hagelin et al. .... H03H 9/02244 333/200 |
| 2009/0153258 | A1 | 6/2009 | Lutz et al. |
| 2009/0158566 | A1 | 6/2009 | Hagelin et al. |
| 2010/0107736 | A1 | 5/2010 | Lu et al. |
| 2010/0127596 | A1 | 5/2010 | Ayazi et al. |
| 2010/0232119 | A1* | 9/2010 | Schmidt et al. ..... B81C 1/0023 361/746 |
| 2010/0327701 | A1 | 12/2010 | Grannen et al. |
| 2011/0266925 | A1 | 11/2011 | Ruby et al. |
| 2011/0305120 | A1 | 12/2011 | Hessler et al. |
| 2012/0013412 | A1 | 1/2012 | Winkler et al. |
| 2012/0132003 | A1* | 5/2012 | Comi et al. ......... G01P 15/0888 73/514.29 |
| 2012/0142144 | A1* | 6/2012 | Taheri .................. B81B 7/007 438/107 |
| 2012/0186338 | A1* | 7/2012 | Bonnat .................... G01P 5/04 73/272 R |
| 2012/0217614 | A1* | 8/2012 | Burgyan et al. ..... H01L 23/057 257/531 |
| 2012/0230159 | A1 | 9/2012 | Hessler et al. |
| 2012/0286903 | A1* | 11/2012 | Prunnila et al. ..... B81B 3/0072 333/234 |
| 2013/0001709 | A1* | 1/2013 | Liu ..................... H05K 3/3431 257/415 |
| 2013/0106246 | A1 | 5/2013 | Raieszadeh et al. |
| 2013/0187724 | A1* | 7/2013 | Jaakkola et al. ......... H03H 9/19 331/158 |
| 2013/0194071 | A1* | 8/2013 | Sløgedal et al. . G06K 19/07701 264/105 |
| 2013/0264610 | A1* | 10/2013 | Chen et al. .......... B81C 1/0023 257/252 |
| 2013/0270660 | A1* | 10/2013 | Bryzek et al. ......... H01L 29/84 257/418 |
| 2013/0285676 | A1 | 10/2013 | Rahafrooz et al. |
| 2016/0099702 | A1 | 4/2016 | Jaakkola et al. |
| 2016/0099703 | A1 | 4/2016 | Jaakkola et al. |
| 2016/0099704 | A1 | 4/2016 | Jaakkola et al. |

OTHER PUBLICATIONS

Matsuda, Satoru et al., "Correlation Between Propagation Loss and Silicon Dioxide Film Properties for Surface Acoustic Wave Devices," IEEE Transactions on Ultrasonics, Ferroelectrics, and Frequency Control, vol. 60, No. 5, May, 2013, pp. 993-997.

Bachelet et al., "Structural-energy calculations based on norm-conserving pseudopotentials and localized Gaussian orbitals", Physical Review B, Vol. 24, No. 8, pp. 4745-4752, Oct. 1981.

Bruner et al., "Electronic Effect in the Elastic Constants of Germanium", Physical Review Letters, Vol. 7, No. 2, pp.55-56, Jul. 1961.

Cerdeira et al., "Effect of Carrier Concentration on the Raman Frequencies of Si and Ge", Physical Review B, Vol. 5, No.4, pp. 1440-1454, Feb. 1972.

Csavinszky et al., "Effect of Doping on the Elastic Constants of Silicon", Physical Review, Vol. 132, No. 6, pp. 2434-2440 Dec. 1963.

Dan, Wanling et al. "Thin-Film Piezoelectric-On-Substrate Resonators With Q Enhancement and Tcf Reduction," Micro Electro Mechanical Systems (MEMS), 2010 IEEE 23rd International Conference, Jan. 24-28, 2010, Wanchai, Hong Kong, pp. 727-730, ISSN: 1084-6999.

Dictionary.com definition of pillar https://www.dictionary.com/browse/pillar.*

ECN Magazine, "World's First MEMS Real Time Clock," Nov. 29, 2010, 4 pages.

EE Times, "Built-in MEMS resonators beat quartz," Nov. 30, 2010, 3 pages.

Einspruch et al., "Electronic Effect in the Elastic Constant C' of Silicon", Applied Physics Letters, Vol. 2, No. 1, pp. 1-3, Jan. 1963.

European Patent Office, International Search Report and Written Opinion of International Searching Authority in International Application No. PCT/US2016/038275, Nov. 2, 2016, 19 pages.

Hall, "Electronic Effects in the Elastic Constraints of n-Type Silicon", Physical Review, Vol.161, No.3, pp. 756-761, Sep. 1967.

Hammond et al., "Intertial Transducer Design for Manufacturability and Performance at Motorola," 12th International Conference on Transducers, Solid-State Sensors, Actuators and Microsystems, 2003, Piscataway, NJ, USA, IEEE, Jun. 8, 2003, pages 85-90, vol. 1.

Hao, Zhili et al., "An analytical study on interfacial dissipation in piezoelectric rectangular block resonators with in-plane longitudinal-mode vibrations," available online Aug. 21, 2015, Elsevier Sensors and Actuators A 163 (2010), 401-409.

Harrison, "Pseudopotential theory of covalent bonding", Physical Review B, Vol. 14, No. 2, pp. 702-711, Jul. 1976.

Hopcroft et al., "What is the Young's Modulus of Silicon?", Journal of Microelectromechanical Systems, Vol. 19, No. 2, pp. 229-238, Apr. 2010.

Hung, Li-Wen et al., "Capacitive-Piezoelectric Transducers for High-Q Micromechanical AlN Resonators," Journal of Microelectromechanical Systems, Vol. 24, No. 2, Apr. 2015, pp. 458-473.

Jaakkola, Antti et al. "Experimental Determination of the Temperature Dependency of the Elastic Constants of Degenerately Doped Silicon, 2013 Joint UFFC, EFTF and PFM Symposium, pp. 421-424, IEEE.

Kaajakari, "Silicon as an anisotropic mechanical material - a tutorial", http://www.kaajakarl.net/-ville/research/tutorials/tutorials.shtml, pp. 1-5.

Keyes, "Density of States of Degenerate n-Type Silicon from Elastic Constants", Solid State Communications, Vol. 32, No. 2, pp. 179-180; 1979.

Keyes, "Elastic Properties of Diamond-Type Semiconductors", Journal of Applied Physics, Vol. 33, No. 11, pp. 3371-3372, Nov. 1962.

Kim, "Electronic effect on the elastic constant C44 of n-type silicon", J. Appl. Phys., Vol. 52, No. 5, pp. 3693- 3695, May 1981.

Kourani, Ali et al., "A 76.8 MHz temperature compensated MEMS reference oscillator for wireless handsets," available online Apr. 20, 2015, Elsevier Microelectronics Journal 46 (2015), pp. 496-505.

Lee, Hyung Kyu et al., "Electrostatic Tuning to Achieve Higher Stability Microelectromechanical Composite Resonators," IEEE Journal of Microelectromechanical Systems, Vol. 20, No. 6, Dec. 2011, pp. 1355-1365.

McSkimin, "Measurement of Elastic Constants at Low Temperatures by Means of Ultrasonic Waves-Data for Silicon and Germanium Single Crystals, and for Fused Silica", Journal of Applied Physics, Vol. 24, No. 8, pp. 988-997, Aug. 1953.

(56) References Cited

OTHER PUBLICATIONS

Melamud, Renata et al., "Temperature-Insensitive Composite Micromechanical Resonators," IEEE Journal of Microelectromechanical Systems, Vol. 18, No. 6, Dec. 2009, pp. 1409-1419.

Nelson, Andrew et al., "A 48 MHz, Hermetic, 0.48 mm2 Chip-Scale Packaged USB3.0 Oscillator Integrating an FBAR Resonator with CMOS Circuitry, 2011 IEEE International Ultrasonics Symposium Proceedings, pp. 1226-1229.

Pensala et al., "Temperature Compensation of Silicon MEMS Resonators by Heavy Doping", Ultrasonics Symposium (IUS), 2011 IEEE International, pp. 1952-1955, Oct. 2011.

Popa, Laura C. et al., "2DEG Electrodes for Piezoelectric Transduction of AlGaN/GaN MEMS Resonators," European Frequency and Time Forum & International Frequency Control Symposium (EFTF/IFC), 2013 Joint, Jul. 21-25, 2013, Prague, pp. 922-925, IEEE.

Pourkamali, Siavash; "High Frequency Capacitive Single Crystal Silicon Resonators and Coupled Resonator Systems," Dissertation at Georgia Institute of Technology; Dec. 2006.

Rodriguez et al., "Structural properties of tetrahedrally coordinated crystals from first-principles calculations of pressure-and total energies" Physical Review B, Vol. 31, No.8, pp. 5327-5334, Apr. 1985.

Ruby, Rich, "Positioning FBAR Technology in the Frequency and Timing Domain," Frequency Control and the European Frequency and Time Forum (FCS), 2011 Joint Conference of the IEEE International, San Francisco, CA, May 2-5, 2011, pp. 1-10, ISBN 978-1-61284-111-3.

Samarao et al., "Temperature Compensation of Silicon Micromechanical Resonators Via Degenerate Doping," Electron Devices Meeting (IEDM), 2009 IEEE International, IEEE Piscataway, NJ, USA, Dec. 7, 2009, pp. 1-4.

Samarao, et al., 'Temperature Compensation of Silicon Micromechanical Resonators via Degenerate Doping", IEDM, pp.789-792, Dec. 2009.

Sanchez-Dehesa et al., "Self-consistent calculation of the internal strain parameter of silicon", Physical Review B, Vol. 26, No. 10, pp. 5960-5962, Nov. 1982.

Seitner, Maximilian J. et al., "Damping of metallized bilayer nanomechanical resonators at room temperature," Sep. 22, 2014, University of Konstanz, Department of Physics, 78457 Konstanz, Germany, pp. 1-17.

Smith et al., "Reevaluation of the derivatives of the half order Fermi integrals", J. Appl. Phys., Vol. 73, No. 11, pp. 7030-7034, Jun. 1993.

Van Camp et al. "First Principles Calculation of Ground State and Electronic Properties of C and Si", Physica Scripta, Vol. 35, pp. 706-709; 1987.

Viilanueva, L.G. et al., "Interface Losses in Multimaterial Resonators," MEMS 2014, San Francisco, CA, USA, Jan. 26-30, 2014, pp. 632-635, IEEE.

White, Jr. B.E. et al., "Internal Friction of Subnanometer a-SiO2 Films," The American Physical Society, Physical Review Letters, Vol. 75, No. 24, Dec. 11, 1995, pp. 4437-4439.

* cited by examiner

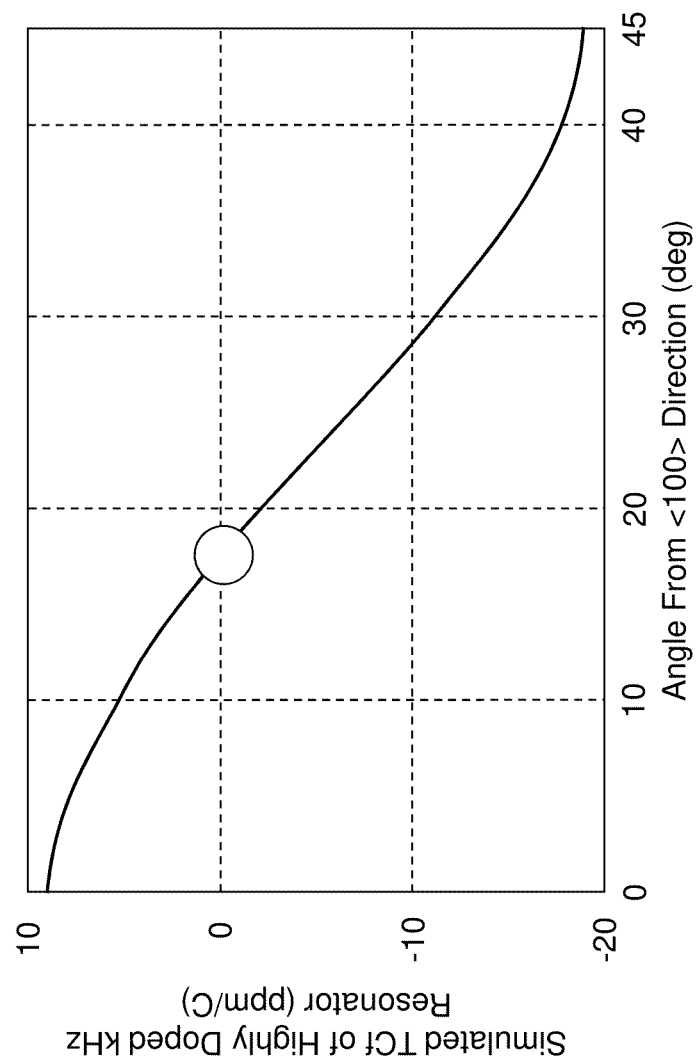

MULTI-DIE INTEGRATED CIRCUIT PACKAGE

CROSS REFERENCE TO RELATED APPLICATIONS

This application is a divisional of U.S. Application No. 13/759,013 filed Feb. 4, 2013 (now U.S. Pat. No. 9,695,036), which claims priority to (i) U.S. Provisional Application No. 61/594,357 filed Feb. 2, 2012, and (ii) U.S. Provisional Application No. 61/617,230 filed Mar. 29, 2012. Each of the above-identified patent applications is hereby incorporated by reference herein.

INTRODUCTION

In one aspect, the present inventions relate to methods of manufacturing microelectromechanical and/or nanoelectromechanical (collectively hereinafter "MEMS") structures and devices/systems including same; and more particularly, in various aspects, to methods of manufacturing MEMS structures comprising one or more moveable, resonating or resonant members (hereinafter "resonant elements") that exhibit desirable resonant frequency stability or response across temperature (for example, a predetermined temperature range such as a desired or predetermined operating range of the resonating or resonant members). In further aspects to designing oscillators that include MEMS resonant elements and electronics to produce output signals with stable frequency across temperature.

Resonant elements exhibit variation in resonant frequency from, among other things, their temperature. This may be described as a frequency function of temperature, a change in frequency with temperature, temperature sensitivity, temperature drift, or by other names (collectively hereinafter "temperature sensitivity"). Controlling, setting, adjusting, or minimizing temperature sensitivity is important to many applications. In this regard, in most implementations, the resonance frequency of the MEMS resonant element should remain substantially stable over a range of operating temperatures. This, however, will not typically be the case as thermally induced changes to the Young's modulus (or other variables) tend to change the mechanical stiffness of the structure. That is, thermally-induced changes to the Young's modulus tend to cause considerable variation or change in the frequency of the output of the resonant element.

The temperature sensitivity of the resonant element may be compensated via circuitry with measured temperature to produce a more stable frequency over temperature. (See, for example, U.S. Pat. 6,995,622).

Temperature sensitivity may be described with measured or expected resonant frequencies at measured or specified temperatures (hereinafter "frequency/temperature pairs"), where there may be few or many frequency/temperature pairs. Additionally, temperature sensitivity may be described by mathematical abstractions that define the frequency as a function of temperature, or the temperature as a function of frequency, or other relationships. One common abstraction is to use frequency/temperature pairs and interpolate and/or extrapolate them, where the number of pairs is less than the number of temperature at which the frequency may be determined. The interpolation or extrapolation may be of a simple linear nature or more complex, for instance a cubic spline. Another common abstraction is a polynomial fit. In this approach an offset, line, or curve represents the frequency with a polynomial of the temperature, or the temperature as a polynomial of frequency, or other polynomial relationships. It is important to note that frequency/temperature pairs need not be measured or identified. Further, the abstraction need not describe the physics behind the temperature sensitivity, for instance the cause of change in Young's modulus, linear expansion, stress, etc. The abstraction may describe the temperature sensitivity with accuracy suitable for the application. When describing the temperature sensitivity in this way, e.g. as a polynomial, one assumes that the abstraction is a sufficiently accurate description or model of the system.

Offset, linear, parabolic, and cubic functions are examples of polynomials, the order may be increased as needed, usually providing better agreement between the abstraction and the actual resonant element temperature sensitivity. It is generally understood that the higher order polynomials may also contain lower order terms, so for instance a cubic polynomial may include parabolic, linear, and offset terms. The order is often described with ordinals, for instance third order for cubic, second order for parabolic, first order for linear, and zero order for offset. For polynomials beyond cubic it is common to refer to the ordinal, for instance fourth or fifth order.

The temperature sensitivity may include a polarity; positive (increasing in frequency with increasing temperature), negative (decreasing in frequency with increasing temperature, or zero (unchanging in frequency with temperature). A numerical value may be assigned to the temperature sensitivity, for instance -31 ppm/C. When a value is assigned it may be used to describe a single value across temperature or a value at a specific temperature. When a value is described as applying over a range of temperatures that implies the temperature sensitivity is not a function of temperature, for instance that it is linear. When the temperature sensitivity is a function of temperature, for instance in a second or higher order polynomial, then a specific sensitivity may be applied at one or more temperatures or a sensitivity range may be given over a temperature range.

In one embodiment a resonant element's frequency across a given temperature range may be made to be within a desired delta from a given frequency. In another embodiment, a resonant element's frequency measured across a temperature range may be made to be within a delta from that resonant element's frequency at a given temperature. In yet another embodiment, a resonant element's frequency across a given temperature range may be made such that the frequency sensitivity has a slope within a given range. In yet another embodiment, the resonant element's temperature sensitivity at some temperature, within a given temperature range, may be made to be zero.

This is called a turnover temperature, and describes a behavior where a resonant element has a temperature sensitivity that changes from one sign to the opposite sign, crossing through zero slope at a temperature. In one embodiment a resonant element has a parabolic temperature sensitivity where the maximum or minimum of the parabolic function is at or near a specific desired turnover temperature. In another embodiment the resonant element has a cubic temperature sensitivity where the function may have two turnover points, one at higher temperature than the other. Higher polynomial orders may lead to further turnover temperatures. It should be recognized that an exact turnover temperature is may not be possible, but rather a turnover temperature within a certain temperature range may suffice. Further, the frequency at the turnover temperature may be a specific value or may be within a range of frequencies. A key characteristic of a turnover temperature is that the change in frequency as a function of temperature may be zero or nearly zero.

A resonant element with a turnover temperature has the advantage that it may be maintained near that temperature and in so doing provide a highly stable reference frequency. The resonant element may be designed such that the turnover temperature is at a higher value than the highest ambient operating temperature. The resonant element may then be heated to near the turnover temperature and maintained at that point as the ambient temperature varies. The result is that the resonant element may have a more stable frequency than a system in which the resonant element's temperature is allowed to vary with the ambient temperature.

It is an embodiment of these inventions that a MEMS resonant element may have a frequency sensitivity that gives a predetermined and stable frequency across a range of temperatures. It is a further embodiment that a MEMS resonant element may have a frequency sensitivity that gives a frequency across a range of temperatures, where the absolute frequency is not tightly determined but the variation is minimized. It is a further embodiment that a MEMS resonant element may have a temperature sensitivity that may have minimal slope across a range of temperatures. It is a further embodiment that a MEMS resonant element may have one or more turnover temperatures within one or more temperature ranges.

A resonant element may also have various frequency functions of temperature depending upon its construction or upon which resonant mode is excited. Two resonant elements may be thermally coupled and operated simultaneously so that their temperatures are nearly equal. In this way their relative frequencies may be used to determine the temperature. In such an approach one resonant element may be made to have minimum temperature sensitivity, a stable frequency, while the other may be made to have maximum temperature sensitivity. The relative frequencies then provide both a stable reference frequency and a measurement of the temperature, or relative temperature, which may be used to compensate the stable frequency to provide a more stable frequency. This may also be done with the more stable resonant element having a turnover temperature and where the relative frequency is used to measure and maintain the temperature at or near the turnover temperature.

The two resonant elements need not be distinct but may be one structure that is resonated (or resonates) in multiple modes (for example, two modes). In this way the temperature of the two resonant elements may be more closely matched because the elements may be physically co-located.

It should be appreciated that the temperature also may be measured by non-resonant means, such as with an electronic sensor. Examples of electronic sensors include thermistors and bipolar transistor circuits. There are a vast number of ways to measure temperature and this discussion is meant to include all arrangements, and is not limited to those described here.

The measured temperature may be used to correct or adjust the frequency of the resonant element. This may be done by pulling the resonant frequency, for instance by varying a bias voltage or load capacitance(s), or this may be done by electronically synthesizing a frequency based on the reference frequency. The adjusted or synthesized frequency often may be more stable over temperature than the reference frequency, but this is not required, in some cases it may be desirable for the adjusted or synthesized frequency to have a specific or predetermined function of temperature. One example of this is where the frequency is a linear function of temperature and thus may be used to transmit that temperature value to external devices.

The circuit that adjusts or synthesizes the frequency may be on an integrated circuit placed far from or near the resonant element(s). When mounted near the resonant element(s) it may be mounted in thermal contact with the resonant element(s) in order that the temperature of the integrated circuits may be coupled to the resonant element(s) so that the temperature measured at the circuit reflects the temperature of the resonant element(s).

Additional advantages may be found where the integrated circuit is in close proximity to the resonant element(s), for instance decreased stray capacitances and thus improved performance, decreased noise, decreased power consumption, and decreased susceptibility to external interference. Thus even when two or more resonant elements are used to both provide a reference and measure temperature, it may be advantageous to have the integrated circuit that drives the resonant elements mounted in close proximity to those elements.

In one embodiment a circuit is mounted proximal to the resonant element(s) to drive the resonant element(s) into motion. The circuit may include functions to measure temperature, and may have functions to adjust the frequency, possibly with a fractional phase locked loop (frac-N PLL), or possibly with a programmable divider. The circuit may have other functions, including non-volatile memory, digital control, test elements, and I/O blocks.

In another embodiment the circuit may be mounted in thermal contact with the resonant element(s), where the circuit die is mounted in contact with the MEMS die. The mounting may include electrical and/or thermal contact, for instance coupled with electrical and/or thermally conductive epoxy or metallic interconnects.

In an embodiment, the MEMS resonant element and circuit may be built into a package. The package may be an epoxy or chip scale package similar to those used for integrated circuits.

The resonant element(s) may be built into a die or lidded such that they are encapsulated. In this way they may be more readily handled, e.g. tested, diced, mounted, and packaged.

In an embodiment, the resonant element(s) may be built on a wafer and lidded with a cover waver to protect it/them during wafer dicing and packaging. The cover waver may be attached with gold compression bonding, eutectic bonding, frit-glass bonding or other bonding techniques.

In another embodiment, the resonant element(s) may be built into an encapsulation structure or structures in or on a carrier wafer. The encapsulation structure or structures may be formed over or around the resonant element(s) in wafer fabrication, and may include silicon on insulator (SOI) structures. All wafer covering and encapsulation techniques, presently know or unknown, are included in the scope of these inventions.

In one embodiment, a MEMS resonant element may be built from a semiconductor, for instance silicon, germanium or carbon. The semiconductor may also be compound materials, for example, silicon-germanium, silicon-carbide, gallium-arsenide, or other.

Specifically, when a resonant element is fabricated in highly doped material, it may provide both positive and negative temperature coefficients of frequency, or turnover temperatures, depending on its structure and the dopant concentration.

In one embodiment, the resonant element may be fabricated from silicon having doping concentrations greater than $10^{15}$ cm$^{-3}$, and preferably, between $10^{15}$ cm$^{-3}$ and $10^{21}$ cm$^{-3}$. In another embodiment, the resonant element may be fabricated from silicon having doping concentrations greater than $10^{19}$ cm$^{-3}$, and preferably, between $10^{19}$ cm$^{-3}$ and $10^{21}$ cm$^{-3}$.

The doping of the material from which a resonant element is fabricated may be n-type or p-type or may be a combination of n-type and p-type. For instance in silicon the dopant(s) may include but are not limited to phosphorus, arsenic, antimony, boron, and aluminum. The dopants may be used individually or in combination. For instance in one embodiment, silicon may be dominantly doped with phosphorus, but there may be arsenic and/or boron present, or the dominant dopant may be boron but there may be phosphorus and/or arsenic present. Other elements, not normally considered dopants, may be present as well, for instance carbon and/or oxygen. Oxygen in particular may be included in concentration levels that contribute to the mechanical behavior of the structures.

In some embodiments the doping may not be uniform but rather may vary in concentration across the resonant elements. The type as well as the concentration may vary.

In one embodiment the resonant elements are built from silicon with a phosphorus dopant concentration between $10^{19}$ cm$^{-3}$ and $10^{21}$ cm$^{-3}$. The dopant is not necessarily uniform, and other elements, such as oxygen, may be present in the material.

In an additional embodiment the material from which the resonant elements may be fabricated may be monocrystalline, polycrystalline, amorphous, or a combination of these. The polycrystalline material may be of random order or ordered, where ordered polycrystalline material may have a preferred or dominant axis of alignment. The material may vary as a function of location in a resonant element, for instance with one or more parts being monocrystalline and others polycrystalline.

The monocrystalline material may be aligned in a controlled way such that a resonant element built in or on it has a desired or predetermined orientation with respect to the multiple crystal axis, planes, normal vectors, crystallographic orientation, or principle axis (hereinafter the "orientation"). This may be the case with, for instance, silicon wafers or SOI wafers that may be procured in a preferred orientation with specified alignment accuracy, for instance a <100> wafer. Hereafter, the term "angle" refers to the orientation of a resonant element or a member of a resonant element with respect to the orientation of the single crystal material or the dominant orientation of the polycrystalline material from which it is made.

The material, crystalline type, doping type, doping concentration, resonant element shape, resonant mode shape, and orientation contribute to a resonant element's temperature sensitivity and to the variation of that temperature sensitivity over process variations.

These and other parameters may be selected to minimize the sensitivity of the temperature sensitivity to fabrication process variations. For example, in one embodiment, the material, crystalline type, doping type, doping concentration, resonant element shape, resonant mode shape, and/or orientation, may be selected to produce resonant members that are maximally insensitive to process variation. In this embodiment, although the parameters may not provide a minimum temperature sensitivity characteristic of a particular resonant element, the parameters may provide a minimum temperature sensitivity of the locus of resonant elements over manufacturing variations or tolerances.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or devices in different figures are labeled similarly. It is understood that various combinations of the structures, components, and/or devices, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIGS. 4A and 4B illustrates an embodiment of a kHz resonant element that may exhibit the desired temperature insensitivity as a function of its rotation angle, and a plot of approximately that sensitivity as a function of angle;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

At the outset, it should be noted that there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Further, in the course of describing and illustrating the present inventions, various architectures, structures, components, functions and/or elements, as well as combinations and/or permutations thereof, are set forth. It should be understood that architectures, structures, components, functions and/or elements other than those specifically described and illustrated, are contemplated and are within the scope of the present inventions, as well as combinations and/or permutations thereof.

With that in mind, in one aspect, the present inventions are directed to a method of manufacturing a microelectromechanical structure having one or more moveable or resonating elements. The method of manufacture fabricates moveable or resonating elements from a substrate (for example, monocrystalline silicon) having a dopant concentration, using, for example, conventional lithographic and etching techniques A desired dopant type, concentration, and pattern may be developed before or during the wafer fabrication.

Figure 1A:
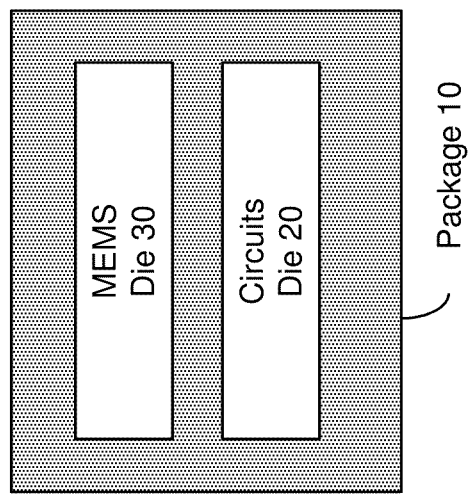
FIGS. 1A-1E illustrates packaging options for the resonant element die and integrated circuit die according to certain aspects and embodiments of the present inventions, including lateral die positioning, die stacking, flip chip construction, and integrated construction.

MEMS resonator elements, or resonators, may be built into systems, and as such may be parts of larger systems. Resonator elements may be used with drive circuits, particularly CMOS circuits, and may be packaged. With reference to FIG. 1A, a package 10, a circuit die 20 and a MEMS die 30 are shown schematically. The MEMS resonant element, or resonator, is part of the MEMS die. It should be understood that the package 10 and circuits 20 contribute to performance of the system, and in particular to the temperature stability of the resonant element. Throughout this description the resonant frequency of the resonant element, or resonator, is described as belonging to the MEMS element, but it should be understood that the circuit and the package may have influence on it and may need to be considered.

Figure 1B:
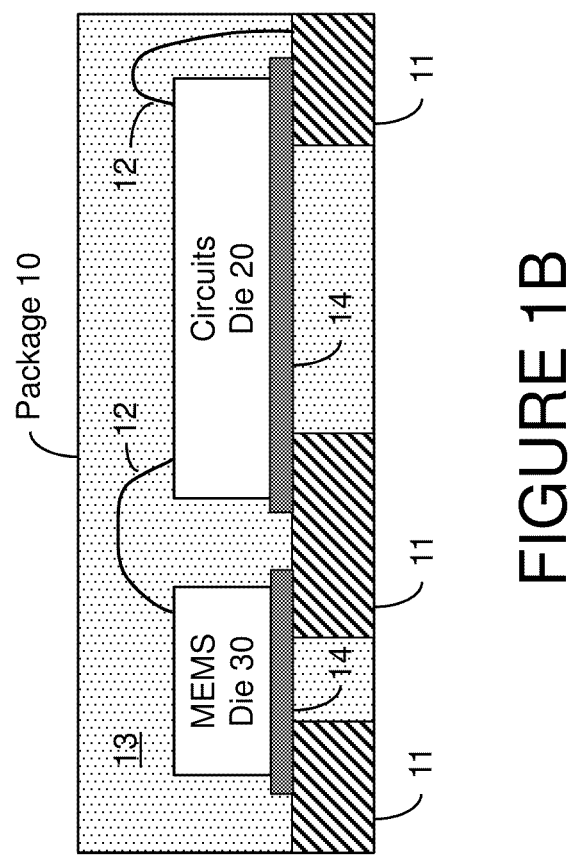
Figure 1C:
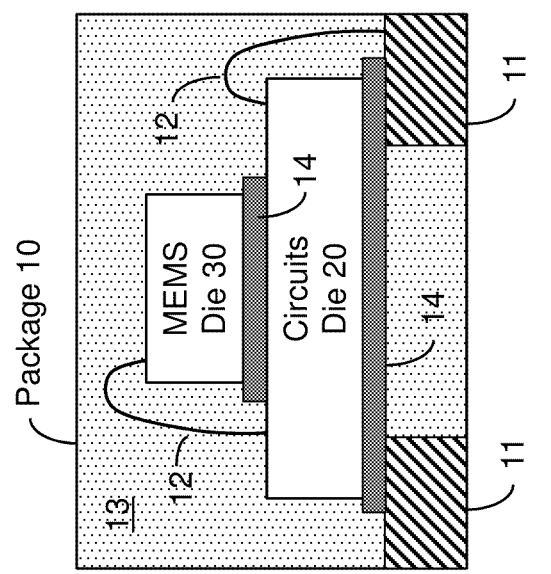
Figure 1D:
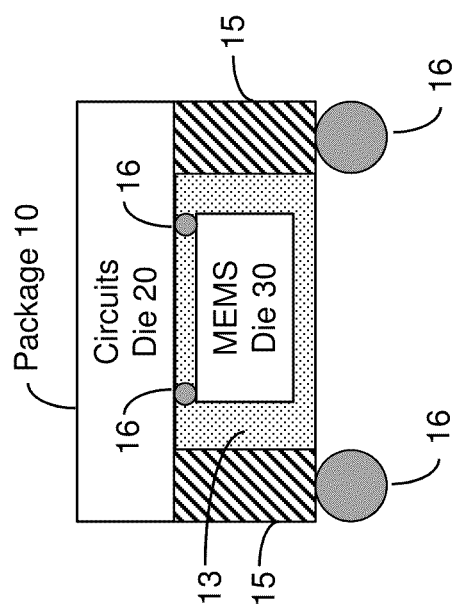

The MEMS die and the circuit die will often be physically packaged together. With reference to FIGS. 1B, 1C, and 1D, one can package them side-by-side, stacked, for instance with the MEMS on the CMOS, with bondwire electrical interconnects, or stacked, for instance with the CMOS on the MEMS, with ball or bump interconnects.

With reference to FIG. 1B, the contacts 11 can be metal pads that are exposed to the outside of the package, the bondwires 12 can connect the pads to the circuitry and the circuitry to the MEMS die, the plastic 13 encloses the die and parts of the contacts, but leaves at least some of the external faces of the contacts 11 exposed, and the epoxy 14 attaches the die to the contacts.

There are many possible variants to the construction shown in FIG. 1B and it should be understood that this description is not limiting. There may be elements not shown that can be used in a package, as well there may be elements that may be omitted from a package.

With reference to FIG. 1C, the MEMS die may be stacked on the circuits die. This may have the advantage that it has a smaller footprint, and may have the disadvantage that it has an overall greater thickness. In some applications and system designs it has the advantage that the MEMS die 30 and the circuit die 20 are in close or intimate electrical and/or thermal contact. In this way the temperature of the MEMS die 30 may be measured at the circuit die 20 with circuit elements. The epoxy 14, encapsulation plastic 13, bondwires 12, and contacts 11 continue to function in the stacked configuration as they do in the side-by-side configuration except that the epoxy between the die may have different properties than that below the die. For example the inter-die epoxy may be electrically conductive or thermally conductive while the under-die epoxy may be electrically insulating.

In some applications it may be desirable to contact the external environment through balls, or bumps, rather than contact pads. It may also be advantageous to build the package with the minimum footprint. In these cases it may advantageous to use a chip-scale package. With reference to FIG. 1D, the MEMS and circuits die can be stacked without bondwires where the electrical contacts are made through bumps or balls 16. This type of package is known in circuit applications but can be extended for these resonant element system packages. These packages may use small balls or bumps 16 between the MEMS and circuit die and larger balls or bumps 16 between the external contact and the circuit die. It may be useful, although not always necessary, to build pillars 15 between the external balls or bumps and the circuit die. These pillars can serve to extend the height of the balls to supply room to mount the MEMS die 30 below the circuits die 20. Plastic 13 may be used to enclose the MEMS die but in some applications it may be omitted.

It should be understood that this is an example of flip chip packaging and should not be understood to be limiting. Other components, for instance underfill material between the MEMS die 30 and the circuits die 20 may be used even though it is not shown in this figure.

Figure 1E:
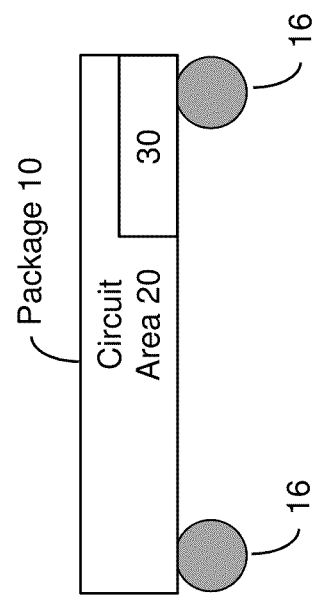

A fully integrated system may also be built. With respect to FIG. 1E, the MEMS functions and the circuit functions may be integrated onto one die with functional areas 30 and 20. That die may be packaged as a chip with balls or bumps 16 to form a chip-scale package 10. It should be clear that an integrated system is described only schematically here and that there are important details not described. This description must be understood to be non-limiting. Further, an integrated system may be packaged similarly to that shown in FIG. 1B with bondwires but only a single die.

The system may also be packaged in a lead frame (not shown). It should be understood that the full diversity of packages used for circuits can potentially be used for the MEMS and circuit combination. With reference to FIG. 1A, the package 10 can take many forms, some common and some uncommon in the electronics industry. All such forms are contemplated in this work. Indeed, new package types developed in the future are contemplated in this work and all packages now known or yet to be developed are explicitly included in this description.

Figure 2A:
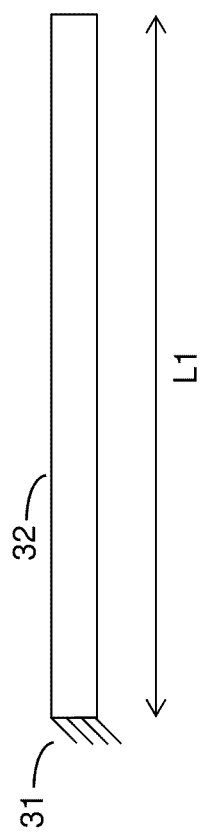
FIGS. 2A-2F illustrates simplified schematic of idealized resonant structure elements and plots of temperature sensitivity of those elements, where the structures are idealized to make the relationships clear.

The resonant element can be of simple or complex shapes, but looking first at a simple structure can show important characteristics that can carry to the more complex structures. With reference to FIG. 2A, a resonant element 32 is attached at an anchor 31 and has length L1. This resonant element may move in-plane or out of plane, and that distinction is not made in this figure. The first bending mode is a swaying of the end. There are other modes as well, including higher order bending modes and extensional modes.

Figure 2B:
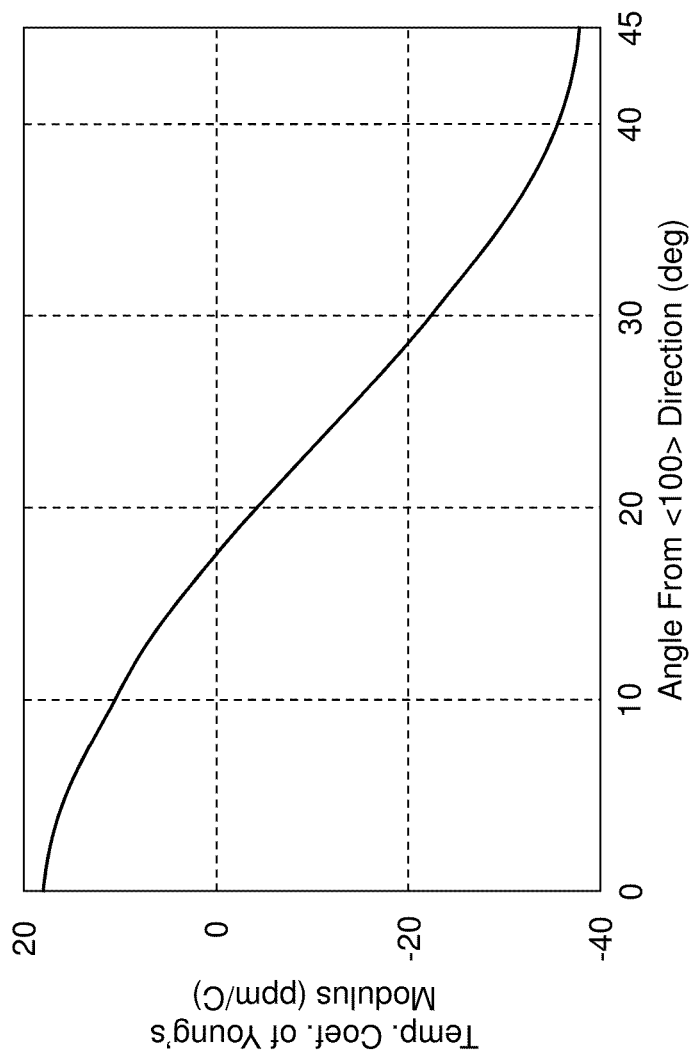

With reference to FIG. 2B, the resonant beams may have positive or negative temperature coefficients of Young's modulus. FIG. 2B shows an example coefficient of a highly doped crystalline semiconductor as a function of the angle of the resonant beam with respect to the crystal orientation of that semiconductor. Note that there are many possible curves or relationships depending on the semiconductor, dopant type, and the dopant density. FIG. 2B represents one that may be found for highly phosphorus doped silicon.

It should be understood that the example of phosphorus in silicon in FIG. 2B should not be taken as limiting. As previously discussed, there are many options for materials and dopants, including but not limited to silicon, silicon-germanium, boron, aluminum, phosphorus, arsenic, and oxygen.

The Young's modulus, shown in FIG. 2B contributes to the resonant frequency function of temperature, the temperature sensitivity, but is not the only contributor. The expansion of the material over temperature contributes, as well as potential stress from the package and electrical interactions with the drive circuit, for instance drive phase and load capacitance.

Figure 2C:
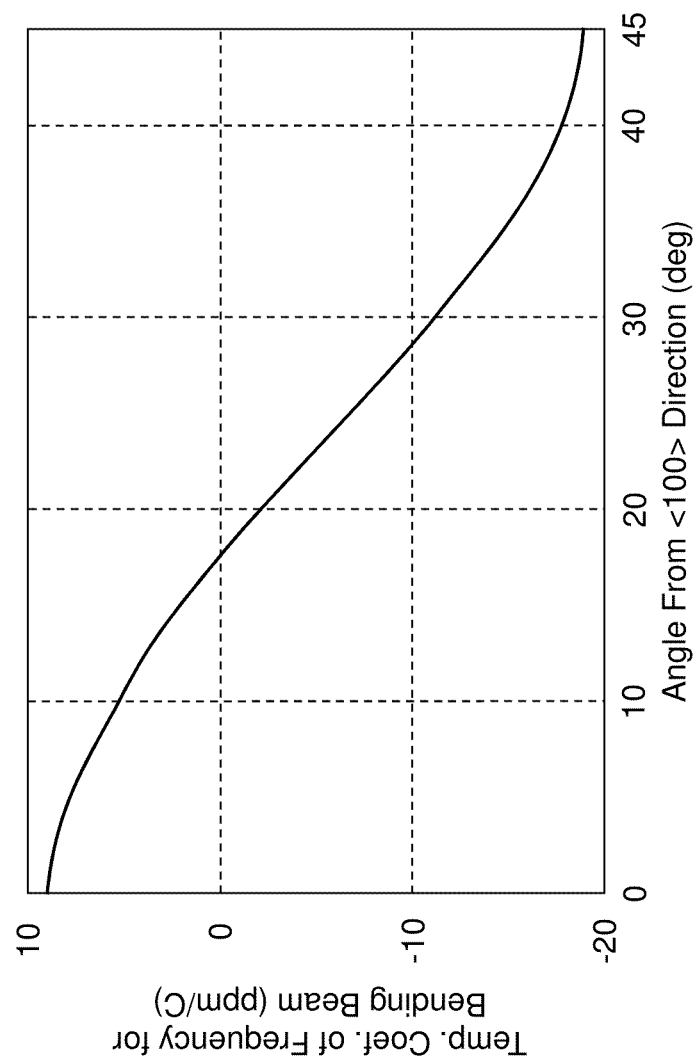

With reference to FIG. 2C, the variation in frequency, or the temperature sensitivity, can be plotted as a function of angle from the crystal lattice. As described above, this plot is exemplary of phosphorus doped silicon, but many other dopants and base materials are possible.

An important characteristic of the curve shown in FIG. 2C is that the temperature sensitivity can be positive or negative and that it can cross through zero. This suggests that a resonant element may be configured for zero temperature sensitivity by building it at a specific angle to the crystal lattice of the semiconductor. It should be remembered that this is just one of many potential curves, and that it is a function of doping concentration, dopant type, semiconductor type, and other variables.

Figure 2D:
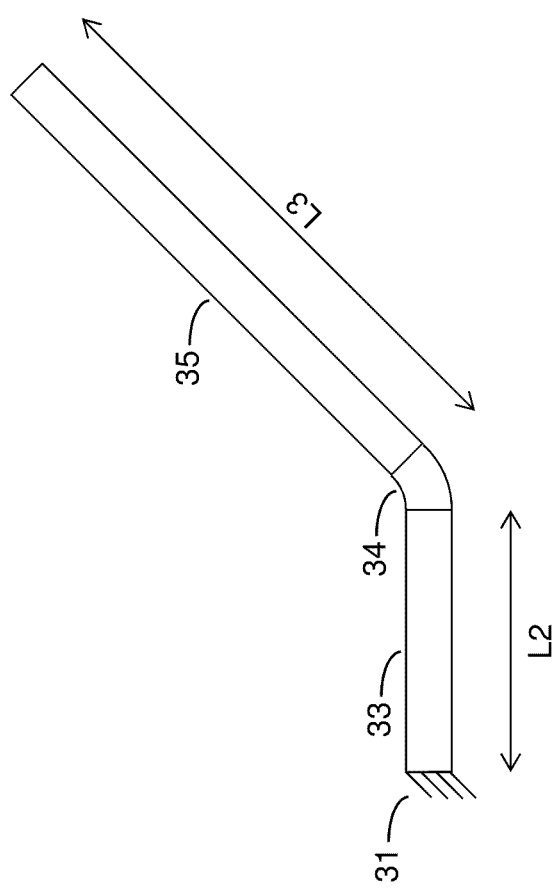

More complex resonant elements may be constructed from simple elements. With reference to FIG. 2D one can construct a beam that includes two (or more) sections at different angles. These beams, 33 and 35 can be connected with section 34 and anchored with 31. In this example they have length L2 and L3. It should be understood that this example shows only two beams while systems with three or more beams are clearly possible.

TABLE 1 (immediately below) tabulates the effective temperature coefficient of frequency, or temperature sensitivity, TCf, as a function of the ratio of the length of the two beams L3 to L2, where they are at an angle of nominally 45 degrees. When they are the same length (L3/L2 = 1) they show a net temperature sensitivity of +6 ppm/C. When they have a length ratio of 4, that is (L3/L2 = 4), the two beams system shows a temperature sensitivity of 0 ppm/C.

TABLE 1

| Ratio of L3/L2 | TCf of 1$^{st}$ Mode |
| --- | --- |
| 1 | +6 ppm/C |
| 2 | +4 ppm/C |
| 4 | 0 ppm/C |
| 6.5 | -4 ppm/C |

It should be well understood that this is a typical case for the silicon and phosphorus materials where the phosphorus concentration is about $10^{20}$ cm$^{-3}$. For other semiconductors, other dopants, or other dopant densities there will be other values for similar tables. One important point that is shown in this table is that the base resonant element beam seen as 33 in FIG. 2D may be aligned with the crystal axis and the net temperature sensitivity may be zero.

Another important point is that the net temperature sensitivity can be interpreted as the weighted sum of the contributing elements. The weighting is partially based on the stress levels seen in each element for the particular resonant mode. The results tabulated in TABLE 1 therefore are for a particular resonant mode, in this case the first bending mode. Other modes may show other temperature sensitivities.

A further important point is that while FIG. 2A was not described as being in-plane or out-of-plane, one can see that as the structures become more intricately shaped they can be built more readily in-plane. FIG. 2D can be built in plane by lithographically defining and etching the shape. The curved section 34 can have a large or small radius, and indeed the choice will impact the results tabulated in TABLE 1 because the stresses through the radius can have various directions with respect to their crystallographic angle.

Figure 2E:
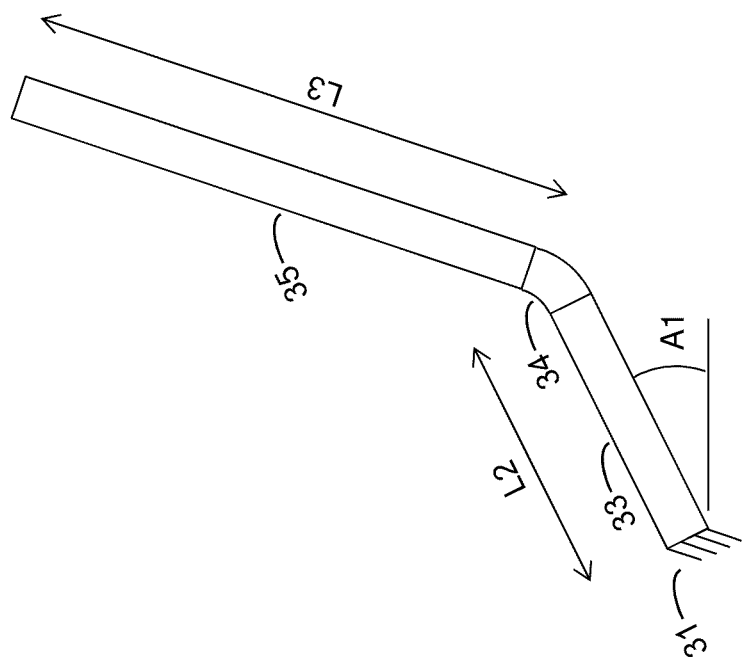

The temperature sensitivity can be further reduced by rotating the structure as shown in FIG. 2E. In this case both the beams 33 and 35 are rotated from the crystal axis, with 33 rotated by an angle A1. Other elements, radius or curved section 34 and lengths of the beams L2 and L3, are maintained.

Figure 2F:
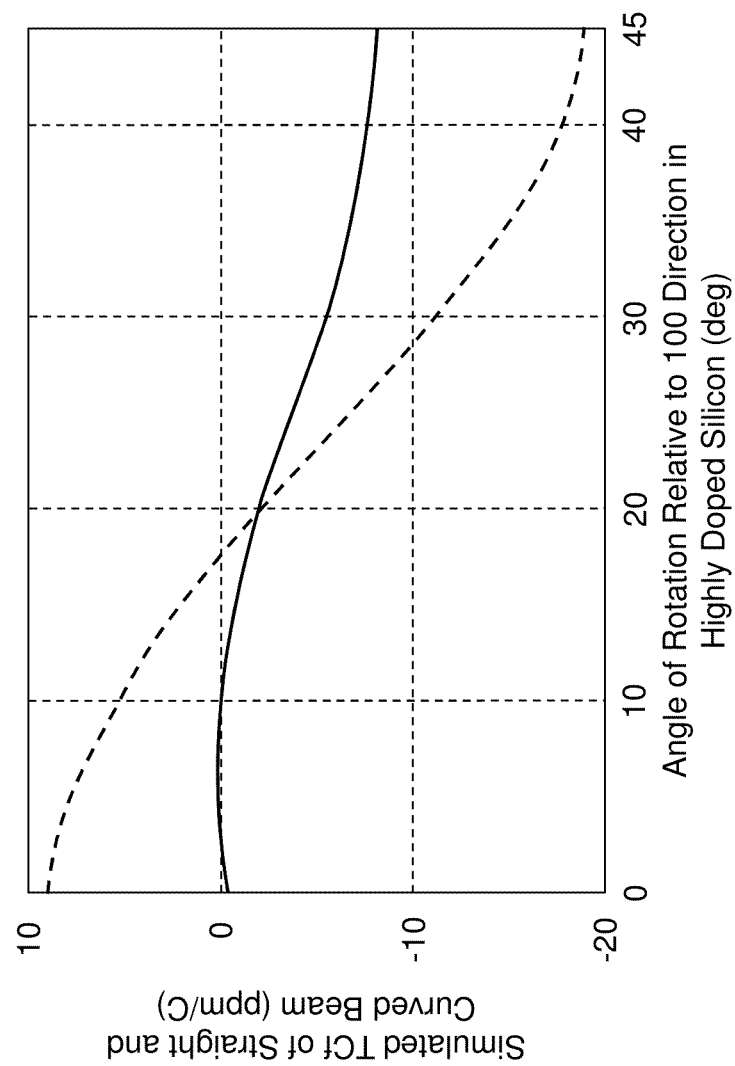

FIG. 2F plots the temperature sensitivity, or TCf, of the rotated assembly. The solid line shows data for the rotated assembly, the dashed line shows data for the simple beam plotted in FIG. 2C for comparison. The rotated assembly of FIG. 2F can be seen to exhibit at least two important characteristics. First the amplitude of the temperature sensitivity over angle is reduced, and second at the points where the temperature sensitivities are zero their slopes are reduced. These observations mean that the rotated assembly has decreased sensitivity to fabrication errors that may result in angle variations. Indeed, FIG. 2F shows an angle near 8 degrees in which the sensitivity to angle errors approaches zero.

It should be born in mind once again that the data plotted in FIG. 2F is exemplary of many potential data sets. This data is again for a highly doped phosphorus and silicon system but other systems may show these behaviors.

Figure 3:
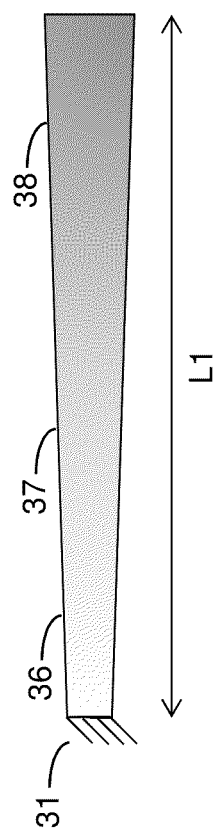
FIG. 3 illustrates a simplified schematic of an idealized resonant element with non-uniform doping.

Extending the exposition, one need not assume that a resonant structure has a uniform doping. FIG. 3 shows a tapered beam with a dopant density that decreases along its length from locations 36, to 37, to 38, where again it is anchored at 31 and has length L1. The temperature sensitivity is again a weighed sum but in this case it is both a weight of the mode shape and the dopant density at each location. As such it is a function of the resonant mode.

The dopant density may also have a gradient across the width of the beam. In particular it may have higher density at the outer parts of the beam and lower in the center parts. This can be the case with diffusive in-doping from the trench sidewalls.

An analysis of temperature sensitivity can be extended to include variation of doping density and of rotated compound shapes. Those analyses may find low slope and low amplitude zero temperature sensitivity angles for particular modes. However, as the resonant elements become more structurally complex it becomes more effective to think in terms of aggregate temperature sensitivity of resonant Eigen modes rather than of weighted sums of contributors. In this perspective there are only Eigen modes of the structure, not sub-structures, and those Eigen modes have temperature sensitivities. Experimental data is usually also of the form that specific modes have specific temperature sensitivities, rather than containing data on individual subcomponents of the resonating elements.

It is also important to understand that simulations in general and the finite element simulations for these resonant structures in particular, are usually of limited accuracy. One must sometimes iterate over design and testing to refine the structure. This design process, including finite element design, and experimental iteration of resonant structures to find low temperature sensitivity structures is part of the inventions described here.

Figure 4A:
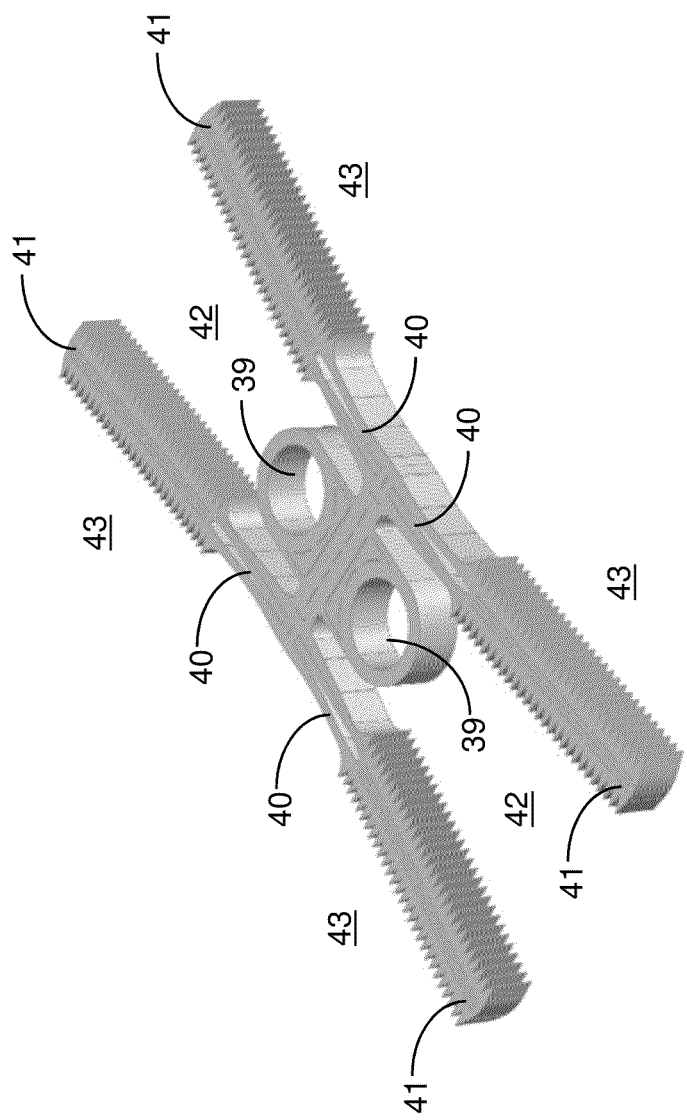

FIG. 4A shows a 524 kHz resonator with anchors 39, flexures 40, and proof masses 41. Drive and sense electrodes (not shown) engage with the resonant element at the serrated edges of 41 and occupy areas 42 and 43.

FIG. 4B shows the temperature sensitivity, or TCf, of the resonator shown in FIG. 4A as a function of rotation to the crystallographic axis. The angle where the temperature sensitivity is zero, about 18 degrees in this case, is marked with a circle. Therefore, this structure may be able to be made insensitive to temperature by rotating it about 18 degrees with respect to the crystallographic axis.

Not that the data in 4B is again for a particular dopant density and gradient, and for a particular dopant in a particular semiconductor. In this case it is for a phosphorus concentration of about $10^{20}$ cm$^{-3}$ in <100> aligned silicon. It should be understood that the resonator shown in FIG. 4A and data in FIG. 4B are only one example of many possible instantiations of the inventions described herein.

Figure 5:
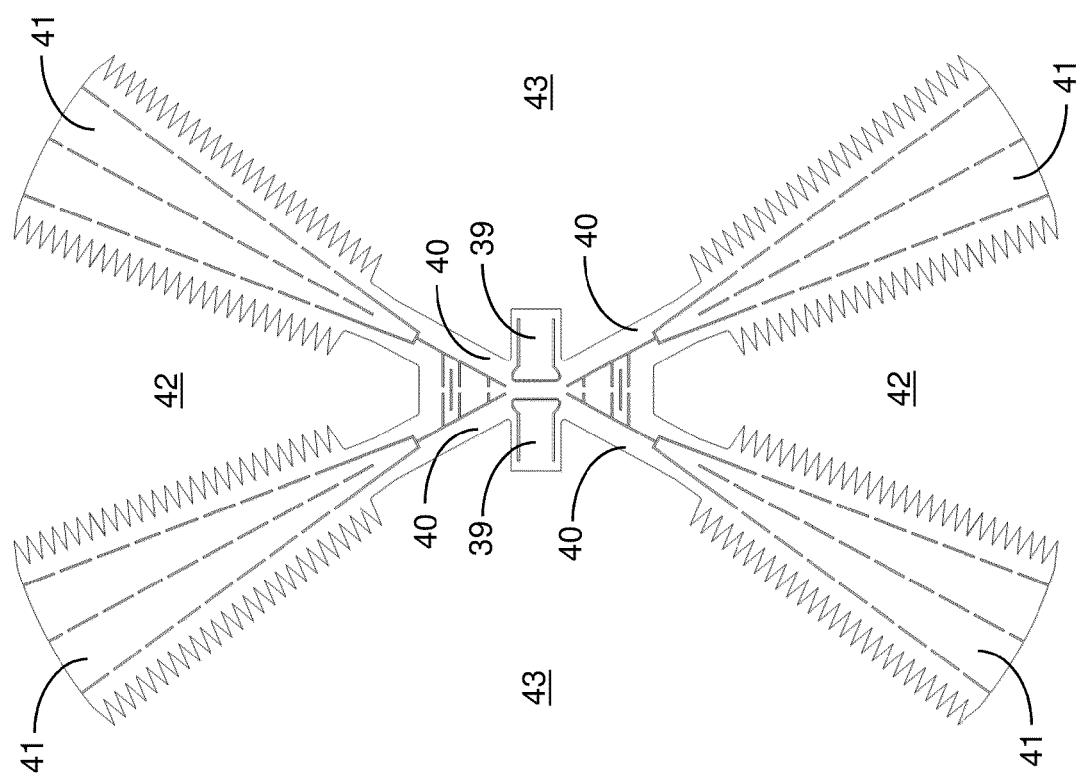
FIG. 5 illustrates another embodiment of a kHz resonant element that may show minimal variation in frequency over both temperature and process variations.

FIG. 5 shows an alternative 524 kHz resonator with beams that are angled outward from the semiconductor axis. The beams 40 are angled at or near the direction that will produce zero temperature sensitivity, but they are rotated on opposite sides of the direction. In this way if the resonator or crystal are rotated, two of the four beams will tend to increase in angle and two beams will tend to decrease in angle. This will have to first order a canceling effect and the structure will be to first order insensitive to small changes in crystallographic orientation. In this way the manufacturing sensitivity to angle may be reduced. The structure includes beams 40, proof masses 41 and electrodes 42 and 43.

Figure 6:
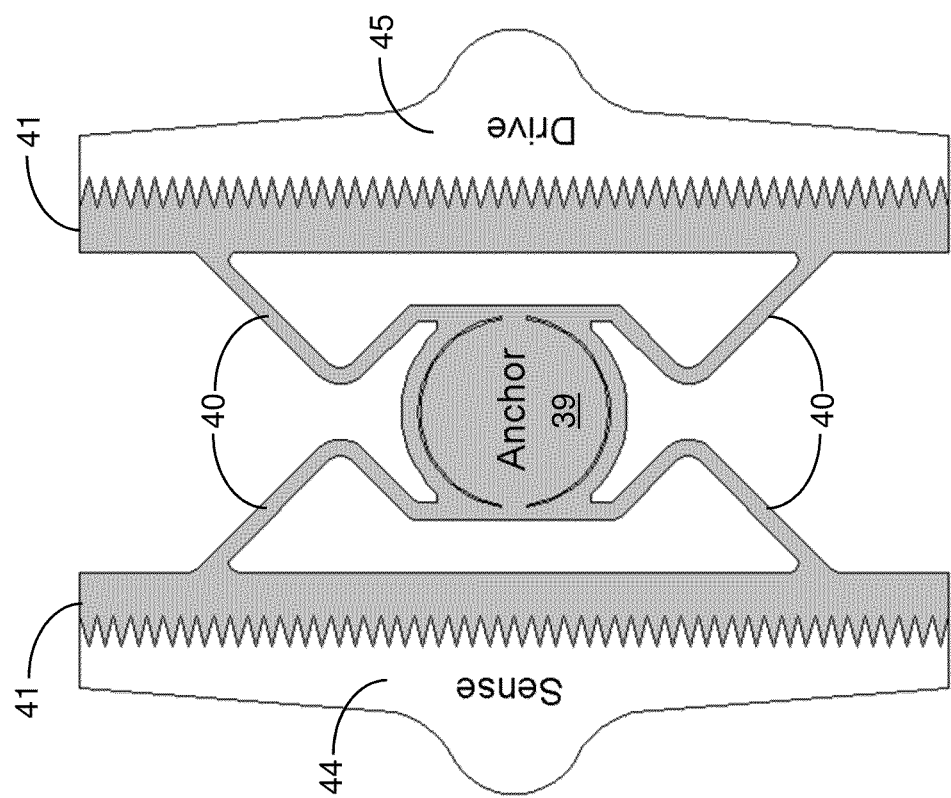
FIG. 6 illustrates another embodiment of a kHz resonant element that may show minimal variation in frequency over both temperature and process variations.

FIG. 6 shows a resonator that includes beams 40 built near zero temperature sensitivity angles. Like the resonator in FIG. 5, these can be designed off the zero angles such that changes in crystallographic alignment have a canceling effect, for instance with parts of the beams increasing and parts decreasing in temperature sensitivity. This resonator may have additional virtues, for instance the teeth engaging the sense and drive electrodes 44 and 45 to the proof masses 41 move in a parallel fashion, which can improve electrical efficiency.

It should be understood that the modification of the resonators from what is shown in FIG. 4A to FIGS. 5 and 6 can enhance manufacturing tolerance. However, it should also be understood that there are other factors that go into the choice of resonant structure shape and there are additional criteria that may be considered for the best design. Indeed may additional criteria are considered and the discussion above should not be considered limiting.

Figure 7A:
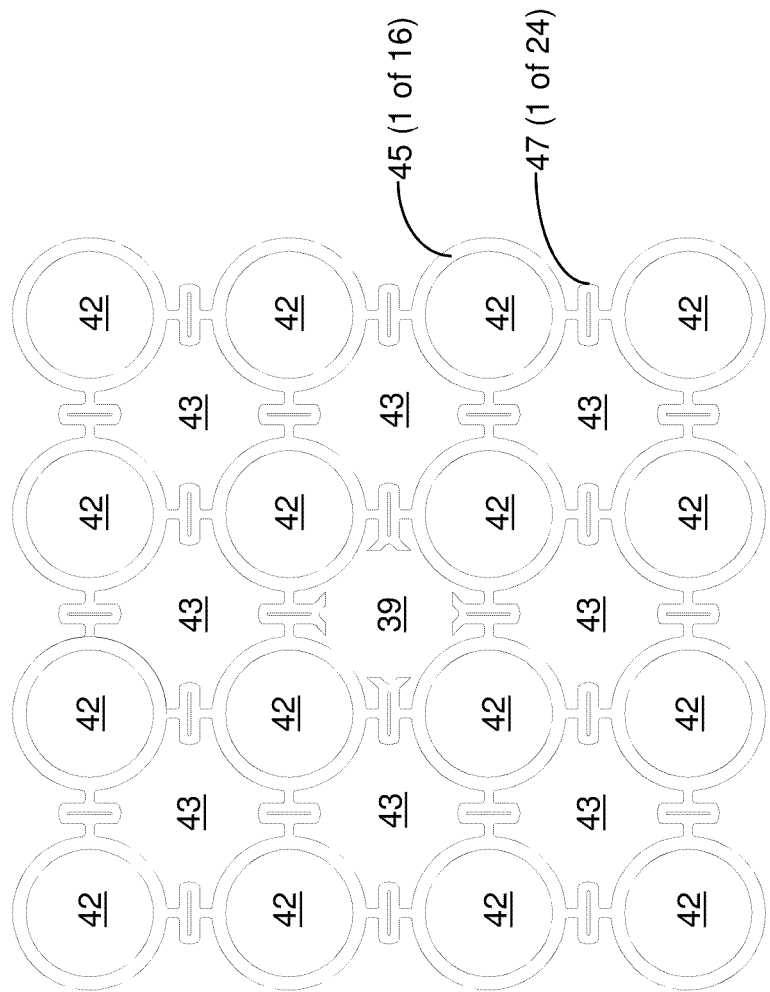
FIGS. 7A and 7B illustrates an embodiment of an arrayed MHz resonant element that may show minimal variation in frequency variation over temperature and a detail of two array cells showing both the design shape and the mode shape.

FIG. 7A shows a 70 MHz resonator built from an array of sixteen rings 45 with couplers 47 outside electrodes 39 and inside electrodes 42. These rings oscillate in a tensile breathing mode, where a single mode is coupled across the rings 45 by the flexures 47. While this figure shows sixteen rings, these resonators can be built with more or less, for instance 64 rings or 9 rings. The anchor 39 shown in the middle can be arrayed across more locations to support larger resonator structures.

Figure 7B:
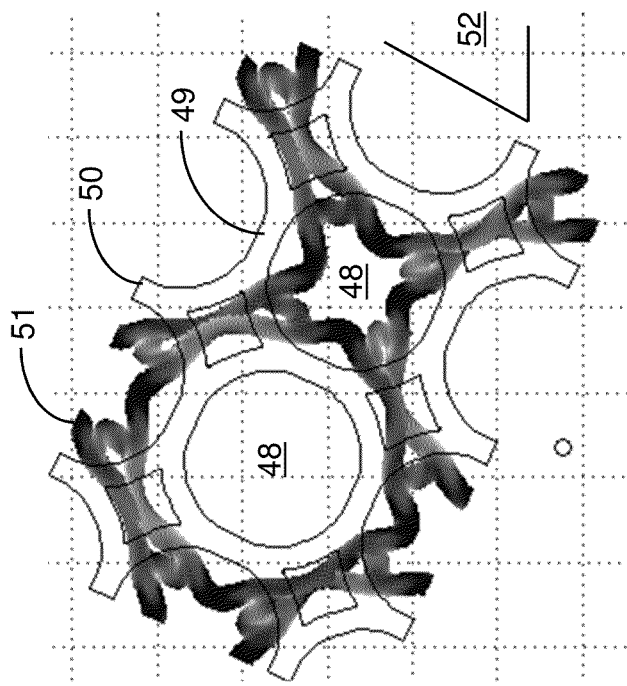

FIG. 7B shows two example elements of a different array. In this figure we see inner electrodes 48 but no outer electrodes. The resonator shape is shown in 50 and a finite element deformation of the desired mode in 51. The angle with respect to the crystallographic axis is shown as 52.

The beam and mass configurations shown in these figures should be understood to be examples of the many possible and contemplated configurations. Various other structures are contemplated and the descriptions here should not be considered limiting. The techniques described in the above figures and the text can be applied widely. For instance rotation of the beam with respect to the crystallographic axis, construction of compound beams, construction of tapered beams, construction of doping gradients, inclusion of multiple materials, semiconductors, and dopants can be combined in many ways to form resonators not shown in these figures or directly describe in the text. However, these combinations, when used to form resonators are within the scope of this invention.

In the description of resonator angles up to this point the temperature sensitivity was described as a single number that can be minimized. However, in a more nuanced view it can be understood to be a non-linear function that can be described as a polynomial. The first order term represents the value we have been discussing to this point. The higher order terms are also functions of the structure, rotation, material, dopant etc., and they may or may not be able to be simultaneously minimized. Therefore there is often a residual curvature in the temperature sensitivity when the first order is removed or nearly removed.

Figure 8:
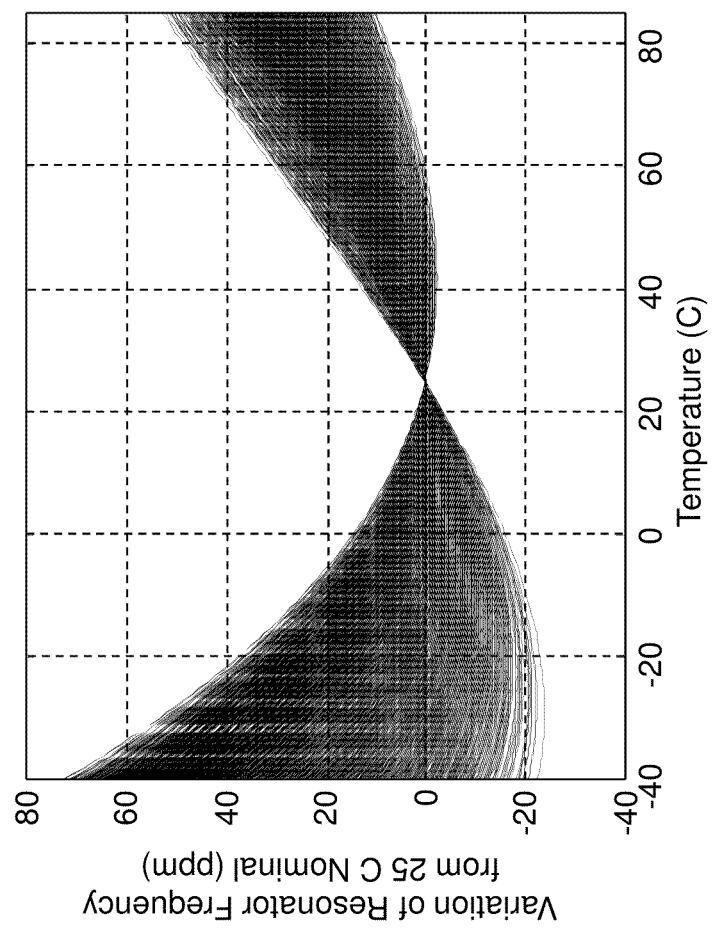
FIG. 8 illustrates an example of frequency variation over temperature of an embodiment kHz resonant element across various fabrication tolerances.

Over fabrication processes the geometries, dopants, and other parameters may shift. These shifts can change the temperature sensitivity of the resonant elements. It can be important to quantify the total range of temperature sensitivities that a resonant element may show across process variations. FIG. 8 shows the locus of temperature sensitivities that a kHz resonator may show over process. Careful analysis in simulation and through measurement may be helpful for proper resonant element construction. Analyzing these across corners and defining structures that are minimally sensitive to process corners is one of the express objects of this invention.

FIG. 8 also shows a residual higher order curvature in the temperature sensitivity as described above. In this case it is predominantly second order upward, but it can take other shapes as well, particularly it can be cubic in some cases.

It should be further noted that various structures (for example, the structures of the MEMS device), circuits and/or circuitry may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such structure and/or circuit expressions may be implemented include, but are not limited to, formats supporting behavioral languages such as C, Verilog, HLDL, and Matlab, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described structures, circuits and/or circuitry may be processed by a processing entity (e.g., one or more processors) within the computer system in conjunction with execution of one or more other computer programs including, without limitation, net-list generation programs, place and route programs and the like, to generate a representation or image of a physical manifestation of such structures, circuits and/or circuitry. Such representation or image may thereafter be used in device fabrication, for example, by enabling generation of one or more masks that are used to form various components of the circuits in a device fabrication process.

Moreover, the various structures (for example, the structures of the MEMS device), circuits and/or circuitry disclosed herein may be represented via simulations using computer aided design and/or testing tools. The simulation of the various structures and/or characteristics or operations thereof may be implemented by a computer system wherein characteristics and operations of such structures and/or circuitry, and techniques implemented thereby, are imitated, replicated and/or predicted via a computer system. The present inventions are also directed to such simulations of the inventive structures and circuitry, and/or techniques implemented thereby, and, as such, are intended to fall within the scope of the present inventions. The computer-readable media corresponding to such simulations and/or testing tools are also intended to fall within the scope of the present inventions.

What is claimed is:

1. A multi-die package comprising:
    an integrated circuit die having a first surface;
    electrically conductive pillars extending perpendicularly from the first surface of the integrated circuit die to a first exterior surface of the multi-die package to enforce a structural offset of the integrated circuit die from the first exterior surface;
    a microelectromechanical system (MEMS) die mounted to the integrated circuit die;
    at least one metallic structure electrically-coupling the MEMS die and the integrated circuit die; and
    encapsulation material disposed between and in contact with the electrically conductive pillars and encapsulating the MEMS die;
    wherein the first integrated circuit die further comprises circuitry to sense a temperature of the MEMS die and to adjust an electrical output of the MEMS die in dependence on sensed temperature;
    wherein the first surface and the MEMS die are mounted in a manner directly coupled by a thermally-conductive material, so as to place the circuitry to sense the temperature and a MEMS structure with a movable element in thermal communication with one another; and
    wherein the MEMS die comprises a crystal silicon resonator having a first longitudinal beam and a second longitudinal beam which are structurally interconnected, the first longitudinal beam being non-co-axial with the second longitudinal beam.

2. The multi-die package of claim 1 wherein the integrated circuit die comprises a complementary metal oxide semiconductor (CMOS) die.

3. The multi-die package of claim 1 wherein the electrically conductive pillars constitute a lateral surface of the multi-die package, the lateral surface being perpendicular to the first surface of the integrated circuit die and perpendicular to the first exterior surface.

4. The multi-die package of claim 1 wherein the at least one metallic structure comprises bondwires that electrically couple the MEMS die to the integrated circuit die.

5. The multi-die package of claim 1 wherein the integrated circuit die comprises circuitry to output a time-varying drive signal to the MEMS die to effect resonant motion of the resonant MEMS structure.

6. The multi-die package of claim 1 wherein the encapsulation material is disposed within a three-dimensional region of the multi-die package between the electrically conductive pillars and between the first surface of the integrated circuit die and the first exterior surface of the multi-die package.

7. The multi-die package of claim 1 wherein the first surface and the MEMS die are coupled to each other by an epoxy as the thermally-conductive material.

8. The multi-die package of claim 1 wherein the crystal silicon resonator has a region that is doped with a phosphorus concentration of at least 10E19 atoms per cubic centimeter.

9. The multi-die package of claim 1 wherein the first longitudinal beam extends in a first direction and the second longitudinal beam extends in a second direction, the first direction being at an angle relative to the second direction.

10. A method of fabricating a multi-die package having a microelectromechanical system (MEMS) die and an integrated circuit die having a first surface, wherein the first integrated circuit die comprises circuitry to sense a temperature of the MEMS die and to adjust an electrical output of the MEMS die in dependence on sensed temperature, the method comprising:
    forming electrically conductive pillars that extend perpendicularly from the first surface of the integrated circuit die to a first exterior surface of the multi-die package to enforce a structural offset of the integrated circuit die from the first exterior surface;
    mounting the MEMS die to the integrated circuit die using a thermally-conductive material, so as to place the circuitry to sense the temperature and a MEMS structure with a movable element in thermal communication with one another and in a manner such that the MEMS die and the integrated circuit die are electrically-connected to one another by at least one metallic structure; and
    disposing encapsulation material between and in contact with the electrically conductive pillars in a manner so as to encapsulate the MEMS die;
    wherein the MEMS die comprises a crystal silicon resonator having a first longitudinal beam and a second longitudinal beam which are structurally interconnected, the first longitudinal beam being non-co-axial with the second longitudinal.

11. The method of claim 10 wherein the integrated circuit die comprises a complementary metal oxide semiconductor (CMOS) die, and wherein forming the electrically conductive pillars that extend from the first surface of the integrated circuit die comprises electrically coupling the electrically conductive pillars with constituent electrical contacts of the CMOS die.

12. The method of claim 10 wherein forming the electrically conductive pillars that extend from the first surface of the integrated circuit die comprises exposing the electrically conductive pillars at a lateral surface of the multi-die package, the lateral surface being perpendicular to the first surface of the integrated circuit die and perpendicular to the first exterior surface.

13. The method of claim 10 wherein mounting the MEMS die to the integrated circuits die in a manner such that the MEMS die and the integrated circuit die are electrically-connected to one another by at least one metallic structure comprises using bondwires to electrically-couple the MEMS die to the integrated circuit die.

14. The method of claim 10 wherein mounting the MEMS die to the integrated circuit die comprises mounting the MEMS die to an integrated circuit die that, when powered, outputs a time-varying drive signal to the MEMS die to effect resonant motion of the resonant MEMS structure.

15. The method of claim 10 wherein disposing encapsulation material between and in contact with the electrically conductive pillars to encapsulate the MEMS die comprises disposing encapsulation material within a three-dimensional region of the multi-die package between the electrically conductive pillars and between the first surface of the integrated circuit die and the first exterior surface of the multi-die package.

16. The method of claim 10 wherein disposing encapsulation material between and in contact with the electrically conductive pillars to encapsulate the MEMS die comprises disposing plastic encapsulant between and in contact with the electrically conductive pillars and in a manner that encapsulates the MEMS die.

17. The method of claim 10 wherein the first longitudinal beam extends in a first direction and the second longitudinal beam extends in a second direction, the first direction being at an angle relative to the second direction.

18. A multi-die package comprising:
- an integrated circuit die having complementary metal oxide semiconductor (CMOS) circuitry, including temperature sensing circuitry, the integrated circuit die having a first surface;
- electrically conductive pillars extending perpendicularly from the first surface of the integrated circuit die to a first exterior surface of the multi-die package to enforce a structural offset of the integrated circuit die from the first exterior surface;
- a microelectromechanical system (MEMS) die mounted to the first surface of the integrated circuit die, the MEMS die comprising a MEMS structure with a movable element;
- electrical connections extending between the MEMS die and the integrated circuit die to provide for electrical communication between the MEMS die and the integrated circuit die;
- encapsulation material disposed between and in contact with the electrically conductive pillars and encapsulating the MEMS die;
- wherein the CMOS circuitry further comprises circuitry to adjust an electrical output of the MEMS die in dependence on sensed temperature;
- wherein the MEMS die comprises a crystal silicon resonator having a first longitudinal beam and a second longitudinal beam which are structurally interconnected, the first longitudinal beam being non-co-axial with the second longitudinal; and
- a thermally-conductive epoxy between the first surface of the integrated circuit die and the MEMS die, the thermally-conductive epoxy directly coupling the integrated circuit die and the MEMS die in a manner so as to place the temperature-sensing circuitry and the MEMS structure in thermal communication with one another.

19. The multi-die package of claim 18 wherein the electrically conductive pillars constitute a lateral surface of the multi-die package, the lateral surface being perpendicular to the first surface of the integrated circuit die and perpendicular to the first exterior surface.

20. The multi-die package of claim 18 wherein the electrical connections comprise respective bondwires that electrically couple the MEMS die to the integrated circuit die and wherein the integrated circuit die comprises circuitry to output a time-varying drive signal to the MEMS die to effect resonant motion of the resonant MEMS structure.

21. The multi-die package of claim 18 wherein the encapsulation material is disposed within a three-dimensional region of the multi-die package between the electrically conductive pillars and between the first surface of the integrated circuit die and the first exterior surface of the multi-die package.

22. The multi-die package of claim 18 wherein the crystal silicon resonator has a region that is doped with a phosphorus concentration of at least 10E19 atoms per cubic centimeter.

23. The multi-die package of claim 18 wherein the first longitudinal beam extends in a first direction and the second longitudinal beam extends in a second direction, the first direction being at an angle relative to the second direction.

* * * * *

UNITED STATES PATENT AND TRADEMARK OFFICE
CERTIFICATE OF CORRECTION

| | | |
|---|---|---|
| PATENT NO. | : 11,807,518 B1 | Page 1 of 1 |
| APPLICATION NO. | : 15/627049 | |
| DATED | : November 7, 2023 | |
| INVENTOR(S) | : Berger et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 231 days.

Signed and Sealed this
First Day of July, 2025

Coke Morgan Stewart
*Acting Director of the United States Patent and Trademark Office*